United States Patent [19]

Marmet

[11] 4,103,349

[45] Jul. 25, 1978

[54] OUTPUT ADDRESS DECODER WITH GATING LOGIC FOR INCREASED SPEED AND LESS CHIP AREA

[75] Inventor: Melvin L. Marmet, Corona, Calif.

[73] Assignee: Rockwell International Corporation, El Segundo, Calif.

[21] Appl. No.: 807,460

[22] Filed: Jun. 16, 1977

[51] Int. Cl.² .............................................. G11C 8/02
[52] U.S. Cl. .................................... 365/231; 307/238; 307/243; 307/DIG. 5; 328/119; 328/154; 340/147 T
[58] Field of Search ......... 340/173 SP, 173 R, 166 R, 340/147 T; 307/243, 242, 218, DIG. 5, 207, 238; 364/200 MS File, 900 MS File; 328/119, 154; 365/230, 231

[56] References Cited

U.S. PATENT DOCUMENTS

| | | | |
|---|---|---|---|
| 3,551,900 | 12/1970 | Annis | 340/173 R |
| 3,721,964 | 3/1973 | Barret et al. | 340/173 SP |
| 3,757,310 | 9/1973 | Croxon | 340/173 R |
| 3,774,171 | 11/1973 | Regitz | 340/173 SP |
| 4,006,470 | 2/1977 | Mitarai | 340/173 SP |

*Primary Examiner*—Bernard Konick
*Assistant Examiner*—Donald McElheny
*Attorney, Agent, or Firm*—H. Fredrick Hamann; G. Donald Weber, Jr.

[57] ABSTRACT

A Y address decoder used in conjunction with an X-Y matrix array, high density read-only memory unit, that reduces the number of series FET stages in the electrical path needed to evaluate the logic state of an addressed cell location of such a read-only memory unit. The reduction is achieved by gating logic in which the signal stored in the evaluated cell location, is derived from the output terminals of a tier of decoders, the appropriate decoder being connected directly to an output driver by a gate-controlled switch. The gate signal to render each such switch conductive is generated by an AND-OR circuit in repsonse to a unique Y address code, thereby obviating the otherwise time-consuming requirement for the evaluation signal to flow through additional tiers of decoders.

6 Claims, 9 Drawing Figures

OUTPUT ADDRESS DECODER WITH GATING LOGIC FOR INCREASED SPEED AND LESS CHIP AREA

BACKGROUND OF THE INVENTION

1. Field of the Invention

This invention relates generally to digital computer systems that employ high density memory devices having memory cells for storing signals therein, which signals may be read out in accordance with address signals applied thereto. More specifically, this invention is directed to a Y address decoder that is used to select a Y coordinate of an X-Y matrix memory cell array for evaluation of a memory cell located at the selected X and Y coordinates of such a memory array.

2. Description of the Prior Art

One example of the type of X-Y matrix array high density read only memory unit with which the present invention may be used, is disclosed in U.S. Pat. No. 3,728,696 issued to Polkinghorn on Apr. 17, 1973, also owned by the assignee of the present invention. The high density of that read-only memory unit is achieved by alternating bit lines and ground lines between cell locations. This concept results in a reduction in the number of diffusion regions from three for each two memory gates to two for each two memory gates. However, in such a high density ROM a particular combination of bit line and an adjacent ground line is selected to evaluate the logic state of each cell location. It is well known that in such memory units, the logic states are determined by whether or not a transistor stage is present at a selected cell location. Therefore, evaluation of a memory cell location is achieved by ascertaining whether or not current can be passed through the ground line and bit line that are adjacent to the selected cell location.

An X decoder is usually employed to enable a word line (row of cell locations) that include selected cell locations and a Y decoder is usually employed to enable the appropriate bit line and ground line combination for testing whether current can be passed through a column of cell locations that includes the selected cell location. However, since current can be conducted through only the enabled cells located at the intersection of the selected row and column, only those cell locations are subjected to the current passage test in response to a single set of address signals.

An optimum Y decoder should permit selection of the appropriate bit line and ground line combinations with (1) a minimum of selection logic, (2) a minimum number of series devices to which the evaluation current must pass before applied to an output driver, and (3) without requiring a reduction in the density of cells in the read-only memory unit.

Selection logic minimization is desirable to permit an entire set of memory devices (i.e. memory cell array, X decoder, and Y decoder) to be fabricated on a single integrated circuit chip of reasonable size. Minimization of the number of series devices through which evaluation current must pass is desirable to achieve short readout time delays because each such device contributes to the time delay between the time of the addressing of a cell location and the time of the evaluation of a cell location. Obviating a reduction in memory cell density is clearly desirable to preclude nullification of the advantages otherwise obtained in achieving a high density memory cell configuration.

Known prior art Y decoders exclusively use either direct decode logic such as the logic described below in conjunction with prior art FIGS. 2, 4 and 7, or gating logic. Direct decode logic utilizes the signals of a binary coded selection address to control the conductivity of switches, such as field effect transistors, FETs, that are in the possible paths of the evaluation current of the selected cell locations. Although direct decode logic lends itself to a reduction in the selection logic required, it is disadvantageous from the standpoint of evaluation delay time because a larger number of series devices in the evaluation current path are employed to perform the selection process.

Gating-logic utilizes the signals of a binary coded selection address to generate a corresponding gating signal that is then applied to a single gating switch in the appropriate bit line and to a single gating switch in the appropriate ground line. Although gating-logic lends itself to a reduction in evaluation delay time, it is disadvantageous from the standpoint of the substantial increase in the selection logic required, or, in the alternative, from the standpoint of the decrease in memory cell density required to alleviate the increase in the required selection logic.

SUMMARY OF THE INVENTION

The present invention employs a unique combination of direct decode logic and gating logic to obtain the desirable characteristics of a Y decoder that more closely approaches the optimum than known prior art Y decoders. Decode logic is employed to reduce the number of bit lines for connection to a plurality of gate-controlled switches. Gating logic, in the form of AND-OR circuits, is employed to select the appropriate bit line in accordance with a Y address code.

BRIEF DESCRIPTION OF THE DRAWINGS

To facilitate a description of the Y decoder of the present invention, each figure representing a portion of, or the entire configuration of the invention, is compared with a corresponding figure representing a like portion of, or the entire configuration of a prior art Y decoder of the direct decode logic type.

DESCRIPTION OF A PREFERRED EMBODIMENT

Figure 1:
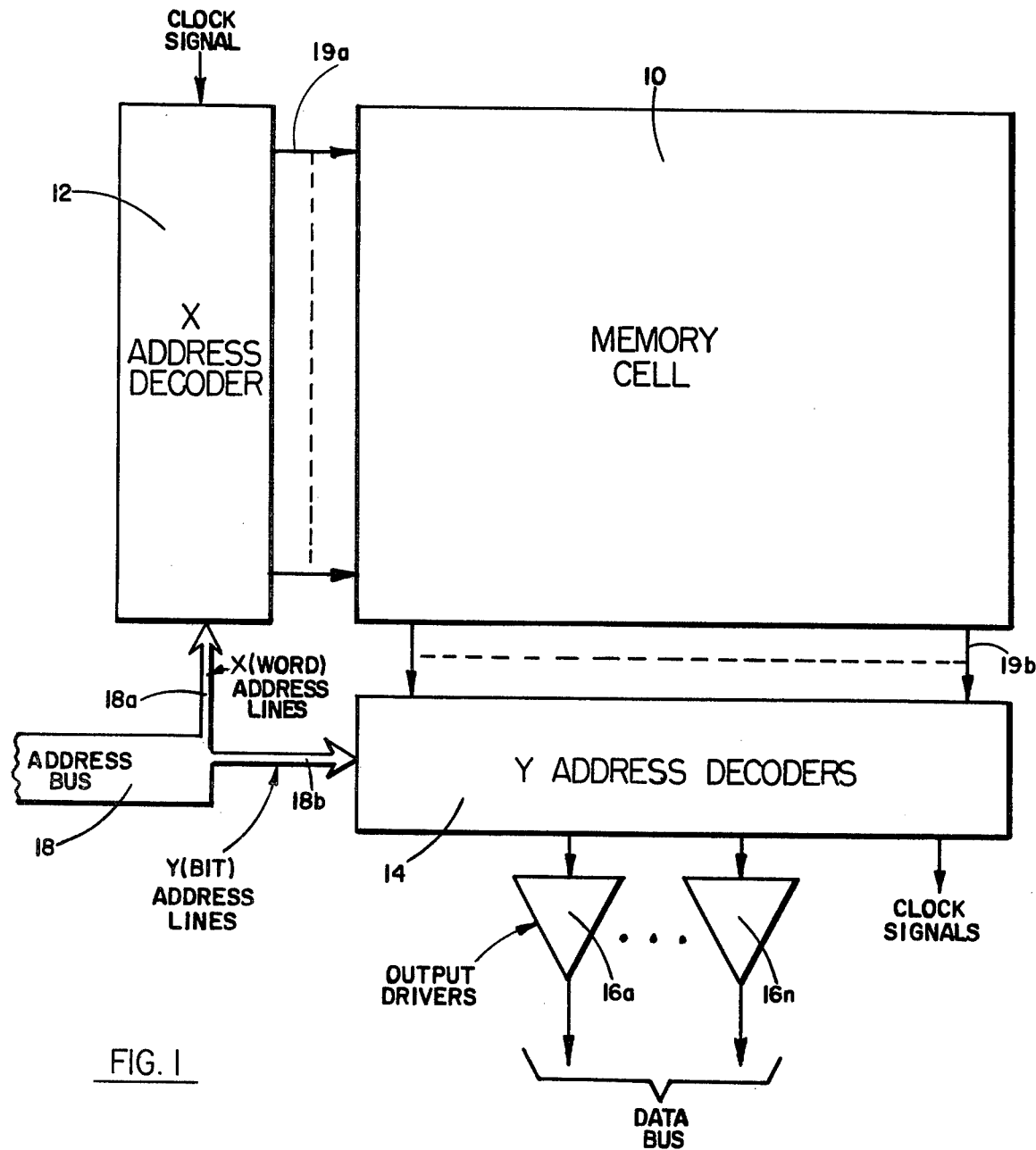
FIG. 1 is a general block diagram of a read only memory unit of the type that employs Y address decoders.

Referring now to FIG. 1, there is shown therein a general block diagram of a read-only memory unit that may be employed in conjunction with a general purpose digital computer. Such a read-only memory unit may be in the form of an integrated circuit chip such as a metal oxide semiconductor large scale integration, MOS/LSI, circuit chip commonly used in conjunction with microprocessor computers.

As shown in FIG. 1, such a read-only memory unit comprises an array 10 of memory cells forming a two dimensional matrix of memory cells addressable by X and Y addresses. Accordingly, the read-only memory unit employs an X address decoder 12 which receives coded address signals via an address bus 18 and X (Word) address lines 18a. Decoder 12 decodes the address signals and transfers a word selection signal to the memory array 10. The word selection signal, applied via word selection lines 19a by the X address decoder to the memory array 10, selects one row of memory cells from which one particular memory cell location is selected by the Y decoder 14 to determine whether a logical 1 or a logical 0 is stored therein.

The read-only unit also includes Y address decoders 14 which respond to coded address signals transferred over Y address lines forming part of the address bus 18 and the Y (bit) address lines 18b. Each of the Y address decoders 14 receives coded address signals and decodes these signals to select one of the bit-lines 19b of memory array 10 for connection to one of output drivers 16a through 16n. The Y address decoders 14 are used to select the appropriate column within memory array 10 which, together with a row selected in accordance with the output signal of X address decoder 12, corresponds to a particular cell location within memory array 10. A selected cell location is evaluated by means of applying the logic signal on the selected bit line 19b to the input terminal of a corresponding output driver of output drivers 16a through 16n. If the selected cell stores a logical ONE, (i.e., a FET stage is included at the cell location), a high voltage is applied to the output driver. If the selected cell stores a logical ZERO, (i.e., no FET stage is at that cell location), a low voltage is applied to the output driver.

As indicated in FIG. 1, the X address decoder 12 and the Y address decoders 14 receive clock signals generated by appropriate circuits within the computer system (not shown). These clock signals control the application of the address signals to the memory array 10 and the reading of the signal on the selected bit line corresponding to a cell location to be evaluated.

In one embodiment, the X address decoder receives seven lines from address bus 18 to select one of 128 word lines within memory array 10. The Y address decoders 14 each receive five lines from address bus 18 to select one of 32 bit lines.

In an 8-bit computer system, there are typically eight Y address decoders, each such decoder producing a signal that corresponds to the truth state of a selected memory cell location. Eight such signals correspond to the 8 bits of a word. The invention herein described relates to an improved Y address decoder of which eight would be employed in an 8-bit system. For purposes of clarity hereafter, the description will focus upon one such decoder for decoding five Y address input signals to select one of 32 input lines. The selected line is applied to an output driver to produce a signal corresponding to one bit of information stored in a read-only memory unit. It will be understood, however, that the invention herein described need not be limited to any particular number of memory cells or address lines since the advantages derived from the invention may be derived in any read-only memory unit which employs a XY matrix addressing scheme.

Figure 2:
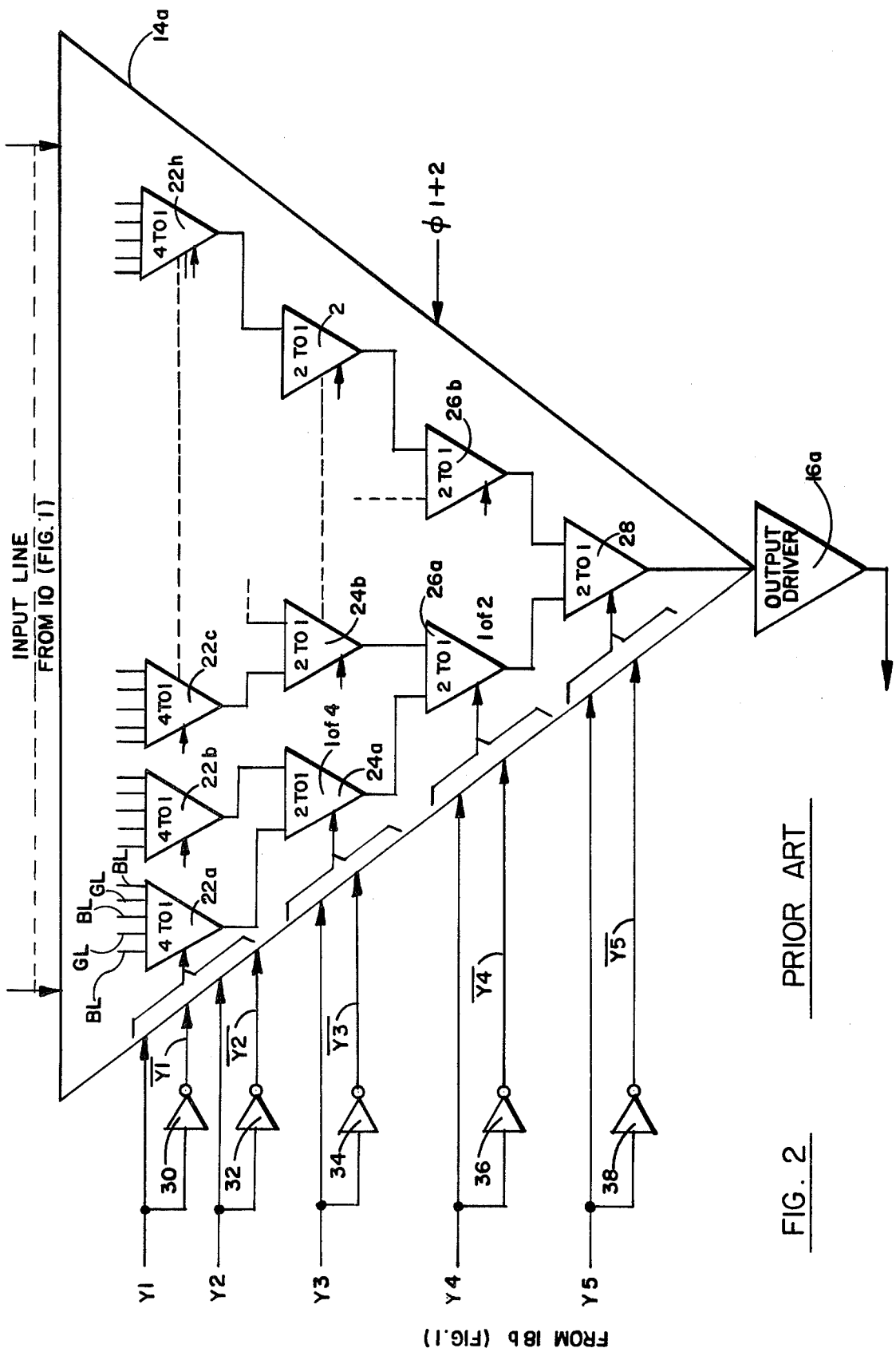
FIG. 2 is a block diagram of a prior art Y decoder of the direct decode logic configuration.

FIG. 2 illustrates a prior art Y decoder 14a for selecting one of 32 bit lines of a read-only memory unit in which a 5-bit Y address is used to select one such bit line to be connected to an output driver.

As indicated on the left side of FIG. 2, the Y address signals are denoted Y1 through Y5, respectively. The combination of truth states of these five Y address signals permits selection of one of the 32 input lines shown at the top of FIG. 2 for connection to output driver 16a, by means of the logic circuits within Y decoder 14a. As indicated in FIG. 2, Y decoder 14a comprises a plurality of selectors arranged in tiers. Each such selector comprises means to select one of two or more input lines for connection to an output line. The selection process depends upon the state of Y address signals that each selector receives. The number of input lines to Y address decoder 14a for N possible selections, includes N-1 bit lines and N-2 ground lines. It will be seen below in conjunction with the description of FIGS. 4 and 5 that memory cell array 10 of FIG. 1 has memory cells arranged between alternating bit lines and ground lines denoted BL and GL respectively. Accordingly, a first tier selector such as selector 22a, receives three bit lines and two ground lines which in combination perform the functions of selecting one of four possible cell columns within the array 10. The input lines to Y address decoder 14a are applied to a first tier of four-to-one selectors 22a through 22h. There are eight such 4:1 selectors to accomodate the 32 bit columns within the memory array.

The output lines of each pair of 4:1 selectors such as selector 22a and 22b are connected to one of the 2:1 selectors 24a through 24d. The output lines of each pair of 2:1 selectors 24a through 24d are connected to one of two 2:1 selectors 26a and 26b and the output lines of selectors 26a and 26b are applied to the single 2:1 selector 28.

Each 2:1 selector 24a to 24d selects, as a function of Y address signals, one of the two 2:1 selectors to which it has input lines connected and applys the selected signal on the selected input line to an output line. A similar selection process, also in response to the Y address signals, is performed by 2:1 selectors 26a and 26b which respectively select one of the two input lines to apply the incoming signal to a single output line. Either the output line of 2:1 selector 26a or the output line of 2:1 selector 26b is connected to the output line of 2:1 selector 28 by selector 28 and that output signal is applied to output driver 16a.

Accordingly, in the prior art Y decoder of FIG. 2, signals stored in memory cell array 10 are evaluated by a series of pyramid shaped tiers which progressively select one memory cell array column to be applied to the output driver 16a.

The five Y address signals Y1 through Y5 are applied to inverters 30, 32, 34, 36 and 38 respectively, to produce the logically inverted version of the corresponding address signals. Accordingly, both the address signals and the inverted address signals are applied to Y address decoder 14a. Address signals Y1 and Y2 and the corresponding inverted signals $\overline{Y1}$ and $\overline{Y2}$, are applied to the eight 4:1 selectors 22a through 22h. These signals select one of the four bit columns controlled by the respective 4:1 selector so that the corresponding input signal to be evaluated is applied to the respective output terminals of the 4:1 selectors. Similarly, Y address signal Y3 and the corresponding inverted signal $\overline{Y3}$ are applied to the second tier of selectors, namely, 2:1 selectors 24a through 24d, to select one of the eight output signals developed by the first tier of selectors 22a through 22h. Similarly, Y address signal Y4 and the corresponding inverter signal $\overline{Y4}$ are applied to the third tier of selectors namely selectors 26a and 26b. The Y address signal Y4 selects one of the two input lines available at the input terminals to each selector 26a and 26b to apply the corresponding signal to the output line of each selector. Y address signal Y5 and the corresponding inverted signal $\overline{Y5}$, are applied to the fourth tier of selectors, namely 2:1 selector 28. This selector makes a final logic selection before the output of Y decoder 20 is applied to output driver 16a for transfer to the data bus of the computer system in which the read only memory unit is employed. Thus, Y address signals Y1 through Y5 enable or disable certain of selectors 22a through 22h, 24a through 24d, 26a and 26b and 28 thereby selecting the signal to be transferred from memory cell array 10 to the output driver 16a.

Figure 3:
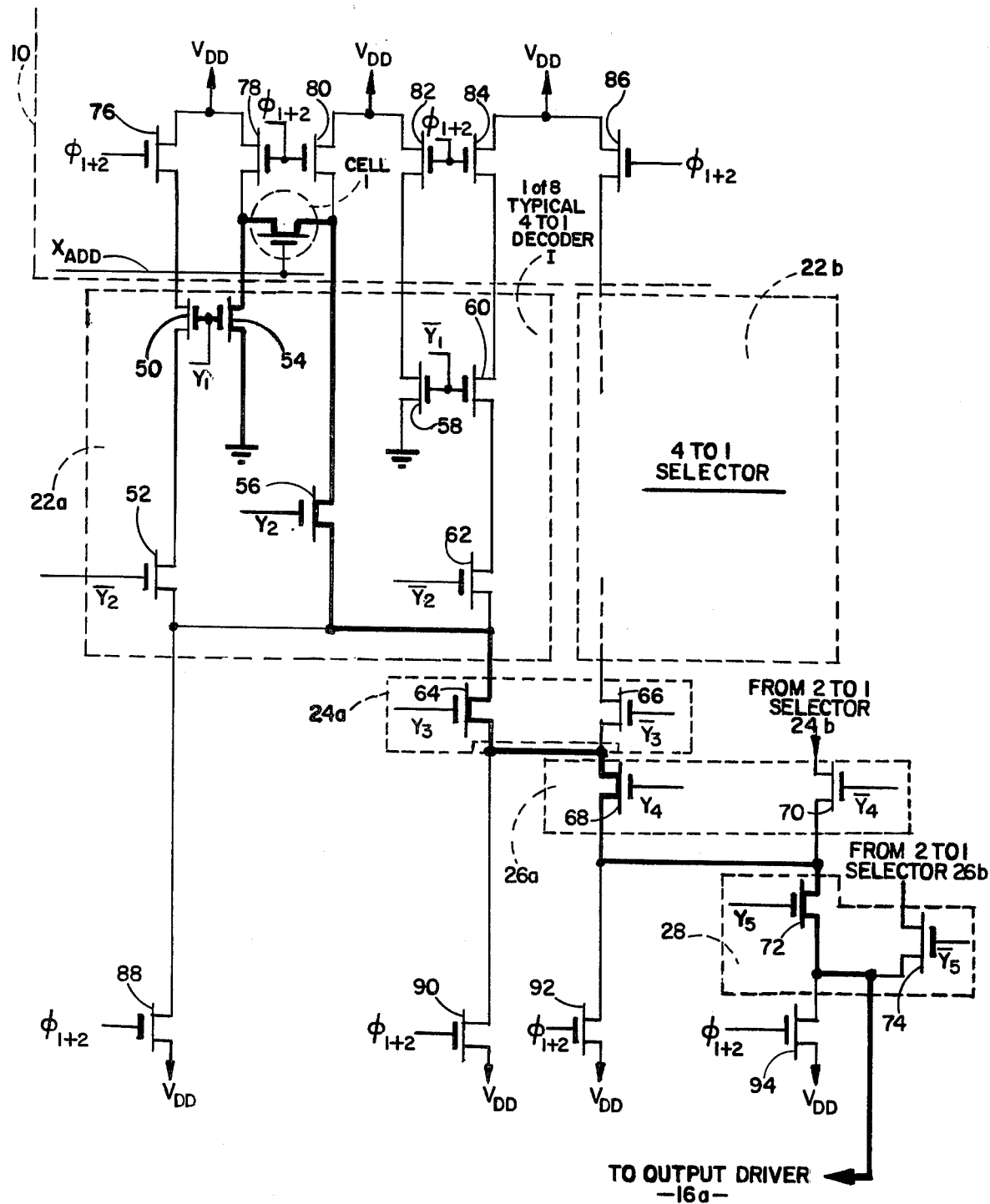
FIG. 3 is a schematic drawing of a portion of a prior art Y decoder of the direct decode logic type.

FIG. 3 is a schematic representation of a portion of prior art Y address decoder 14a and illustrates the manner in which a selected cell position may be evaluated by means of prior art Y decoders. As shown in FIG. 3, memory array 10 includes cell 1 which is assumed to be in a memory cell row that has been enabled by X address line $X_{ADD}$. FIG. 3 includes schematic representations of 4-to-1 selector 22a, 2-to-1 selector 24a, 2-to-1 selector 26a and 2-to-1 selector 28.

As indicated further in FIG. 3, 4-to-1 selector 22a, which is representative of all 4-to-1 selectors 22a to 22h, includes Y address field effect transistor stages (FETs) 50, 52, 54, 56, 68, 60 and 62. The respective gate terminals of these FETs are connected to the appropriate Y address lines for application of Y address signals Y1, $\overline{Y1}$, Y2 and $\overline{Y2}$ as appropriate to select one of the four input signals to be applied to the output terminal of the 4-to-1 selector 22a. The manner in which each 4-to-1 selector operates for selecting a cell position within memory array 10 for evaluation, is identical. The invention herein described and represented in block diagram form by FIG. 5, employs 4-to-1 selectors of the same configuration as those of the prior art decoder of FIG. 3. Accordingly, the description herein of such 4-to-1 selectors is also applicable to the 4-to-1 selector of the invention (to be discussed below).

As shown further in FIG. 3, the prior art Y address decoder includes 2-to-1 selector 24a which comprises field effect transistor stages 64 and 66, the gates of which are, respectively, controlled by the logic states of the address signals Y3 and $\overline{Y3}$. Similarly, 2-to-1 selector 26a comprises field effect transistor stages 68 and 70, the gate terminals of which receive, respectively, Y address signals Y4 and $\overline{Y4}$. Similarly, 2-to-1 selector 28 comprises field effect transistor stages 72 and 74, the gate terminals of which receive Y address signals Y5 and $\overline{Y5}$, respectively.

Figure 7:
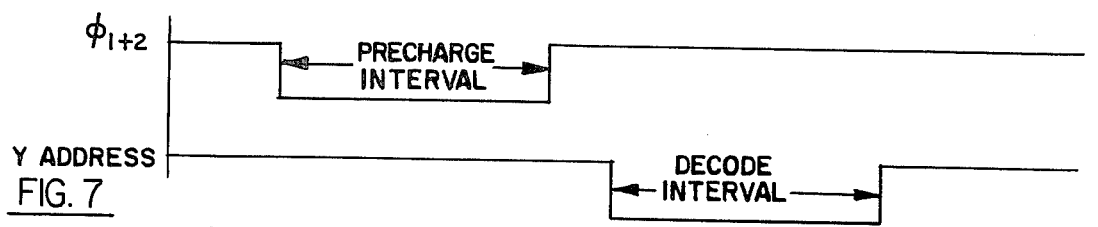
FIG. 7 is a timing diagram that is used to explain the operation of the invention.

All of the remaining field effect transistor stages illustrated in FIG. 3, namely, stages 76, 78, 80, 82, 84, 86, 88, 90, 92 and 94 are utilized to precharge lines in memory array 10 and in Y address decoder 14a during the precharge interval of the clock cycle designated by the negative portion of waveform $\phi_{1+2}$ in FIG. 7.

In a read-only memory unit of the type herein disclosed, the presence of a field effect transistor stage at the cell location being evaluated corresponds to a logical 1 stored at that location and the absence of a stage at the location being evaluated corresponds to a logical 0 stored at that location. Accordingly, the output driver 16a (not shown in FIG. 3) senses a logical 1 when the precharged negative voltage $V_{DD}$ on the input line to output driver 16a is pulled towards ground in response to the presence of a FET at the selected location. If there is no FET at the selected location, output driver 16a senses a logical 0 as a result of the continuing negative voltage $V_{DD}$ at the input terminal of the output driver.

Functional operation of the prior art Y address decoder may be thought of as beginning at the precharge interval of clock signal $\phi_{1+2}$ when the bit lines of the Y decoder 14a and memory array 10 are precharged with the negative voltage $V_{DD}$. Cell evaluation occurs during the decode interval of the Y address clock signal, $Y_{ADDRESS}$ of FIG. 7.

During the decode interval, the Y address signals Y1 through Y5 are applied to the Y address decoder. For discussion purposes, it is assumed that CELL 1 of memory array 10, shown in FIG. 3, is addressed by a set of Y address signals Y1 through Y5, which are all logically TRUE. Accordingly, field effect transistor stages 54 and 56 in 4-to-1 selector 22a receive negative voltage address signals Y1 and Y2 at the gate electrodes thereof which render those stages conductive. Furthermore, FET stage 64 in 2-to-1 selector 24a, FET stage 68 in 2-to-1 selector 26a and FET stage 72 in 2-to-1 selector 28, are also rendered conductive by TRUE signals Y3, Y4 and Y5, respectively. As a result, CELL 1, which is rendered conductive by a TRUE X address signal at $X_{ADD}$, closes a continuous path formed between ground potential at the source terminal of FET stage 54 and output driver 16a, to permit discharge through CELL 1 closing the path which includes FET stage 54, CELL 1, FET stage 56, FET stage 56, FET stage 64, FET stage 68 and FET stage 72 to the output driver 16a. This discharge path is shown as a heavier line in FIG. 3. It will be observed that if any one of the five Y address decode signals, Y1 through Y5 had been logically FALSE, the path between ground potential at the source terminal of FET stage 54 through CELL 1 and the other FET stage 56, 64, 68 and 72 would have been interrupted and another cell location within memory array 10 would have been evaluated with the resultant signal dependent upon whether or not another memory cell had been located at that location.

Figure 4:
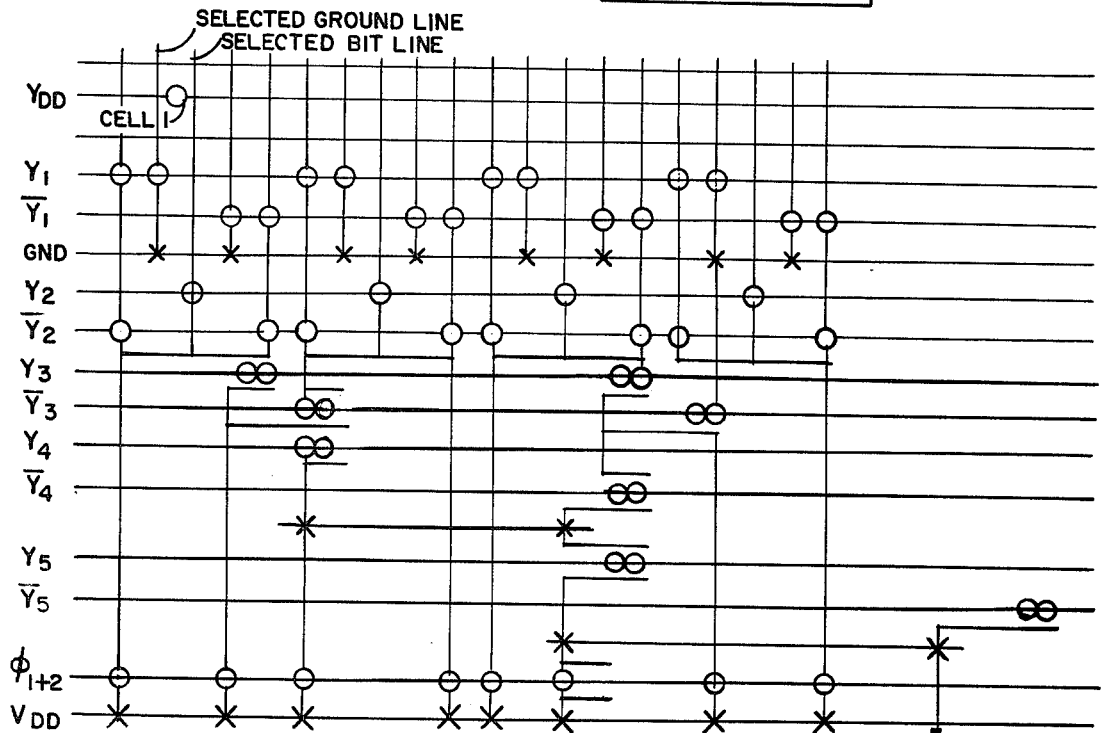
FIG. 4 is a layout drawing of a portion of a prior art Y decoder of the direct decode logic type.
Figure 9:
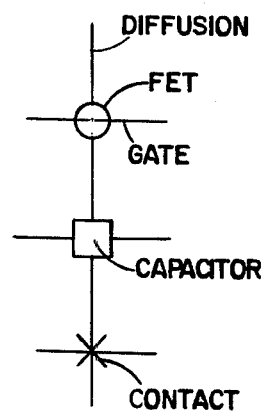
FIG. 9 illustrates the symbols employed in FIGS. 7 and 8.

FIG. 4 is a layout drawing of the prior art Y decoder portion represented by the schematic diagram in FIG. 3. As illustrated in FIG. 9, each circle represents a field effect transistor stage, vertical lines represent diffusion material, horizontal lines represent metal, x's represent contacts between metal and diffusion and a square represents a capacitor.

From FIGS. 2, 3 and 4, it may be seen that the cell evaluation process for the illustrative read only memory array 10 using a prior art Y decoder, requires that the number of FET stages between ground and the output driver connected by means of the path created by a series of such FET stages in a conductive state, must be either six or seven, depending upon the location of the cell being evaluated. As previously indicated, the time delay associated with cell evaluation, is dependent upon and proportional to the number of FET stages through which charge flows to reach the output driver and the data bus of the computer system in which the read-only memory unit is utilized. Accordingly, the relative merits and advantages derived from a Y decoder that permits cell evaluation by mean means of current through a smaller number of FET stages should now be evident. It will now be shown, in conjunction with FIGS. 5, 6 and 8, which respectively indicate the same level of detail as corresponding prior art FIGS. 2, 3 and 4, that Y decoder 40 of the present invention is in all respects compatible with the prior art decoder. It will also be shown that Y decoder 40 can replace prior art decoder 14a without affecting the density of memory array 10 and still provide substantial reductions in cell evaluation time as a result of the reduced number of series FET stages through which charge must flow to evaluate the cell locations of the read-only memory array 10.

Figure 5:
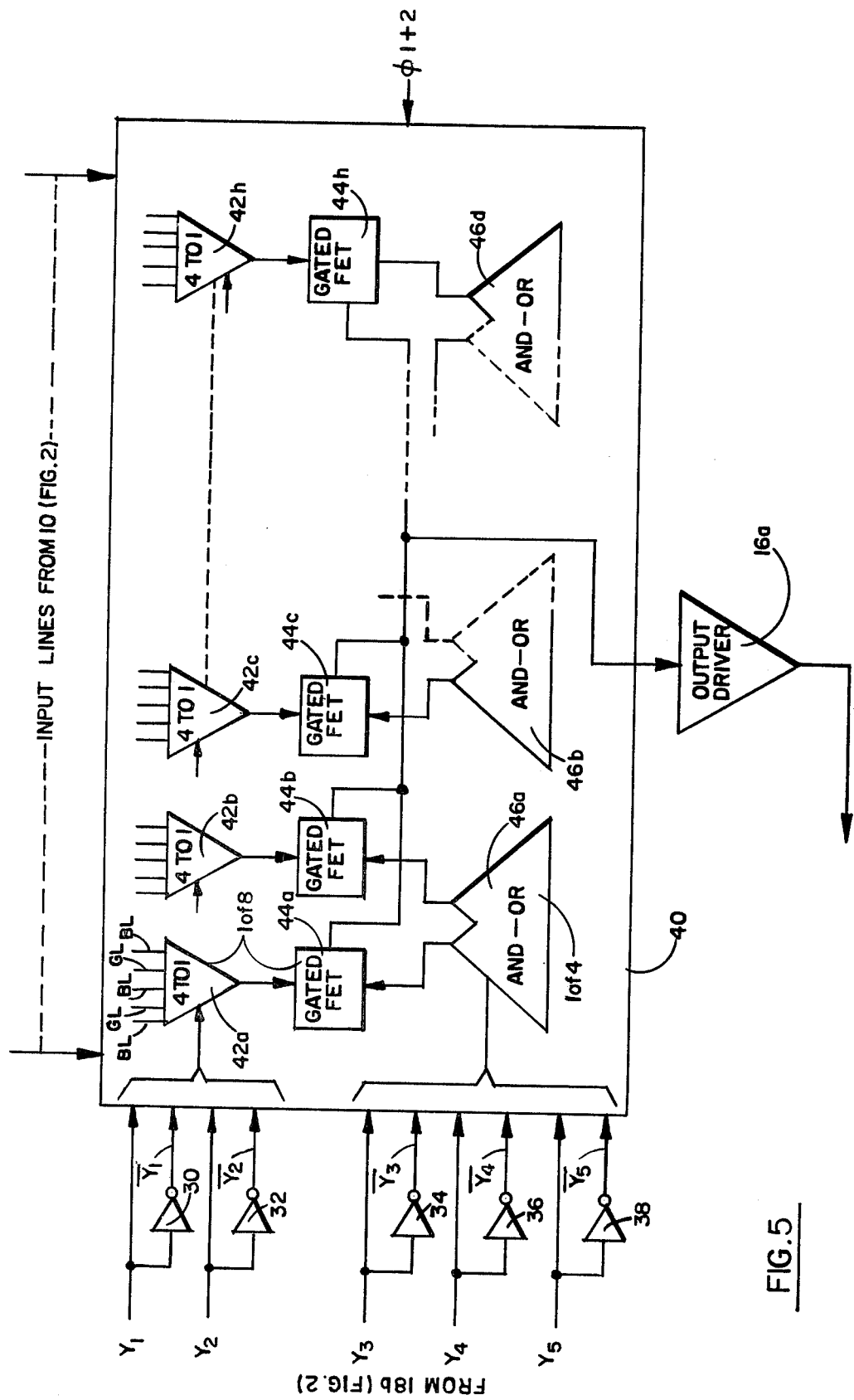
FIG. 5 is a block diagram of a Y decoder incorporating the present invention.

Referring now to FIG. 5, which is, a block diagram of Y decoder 40 of the present invention, it will be observed that the input and output signals are identical to those associated with the prior art device of FIG. 2. There are input lines that transfer signals from the memory array 10 to the Y address decoder 40. There are five Y address signals, Y1 through Y5, which are applied to the address terminals of decoder 40 and which are also applied respectively, to inverters 30, 32, 34, 36 and 38. Consequently, the address signals $\overline{Y1}$ through $\overline{Y5}$ and the inverted corresponding signals $\overline{Y1}$ through $\overline{Y5}$ are applied to decoder 40.

The top row of decoder 40 comprises eight 4-to-1 selectors 42a through 42h, which are identical in all respects to the corresponding eight 4-to-1 selectors 22a through 22h of prior art decoder 14a. However, unlike the prior art decoder, the output signals of 4-to-1 selectors 42a through 42h, are applied to individual gated FETs 44a through 44h, one such gated FET being associated with each 4-to-1 selector. The output terminals of gated FETs 42a are electrically connected together and also connected to output driver 16a. The remainder of the logic circuitry of decoder 40 comprises four AND-OR circuits 46a through 46d, which receive the Y address signals Y3, $\overline{Y3}$, Y4, $\overline{Y4}$, and Y5, $\overline{Y5}$, and in response thereto select one gated FET to be rendered conductive to transfer the output signal of one selected 4-to-1 selector to output driver 16a.

As shown on the right-hand side of FIG. 5, the clock signal $\phi_{1+2}$ is applied to decoder 40 and is used in the same manner as it is used in the prior art decoder 14a of FIG. 2, namely, to render the appropriate precharging FET stages conductive.

Figure 6:
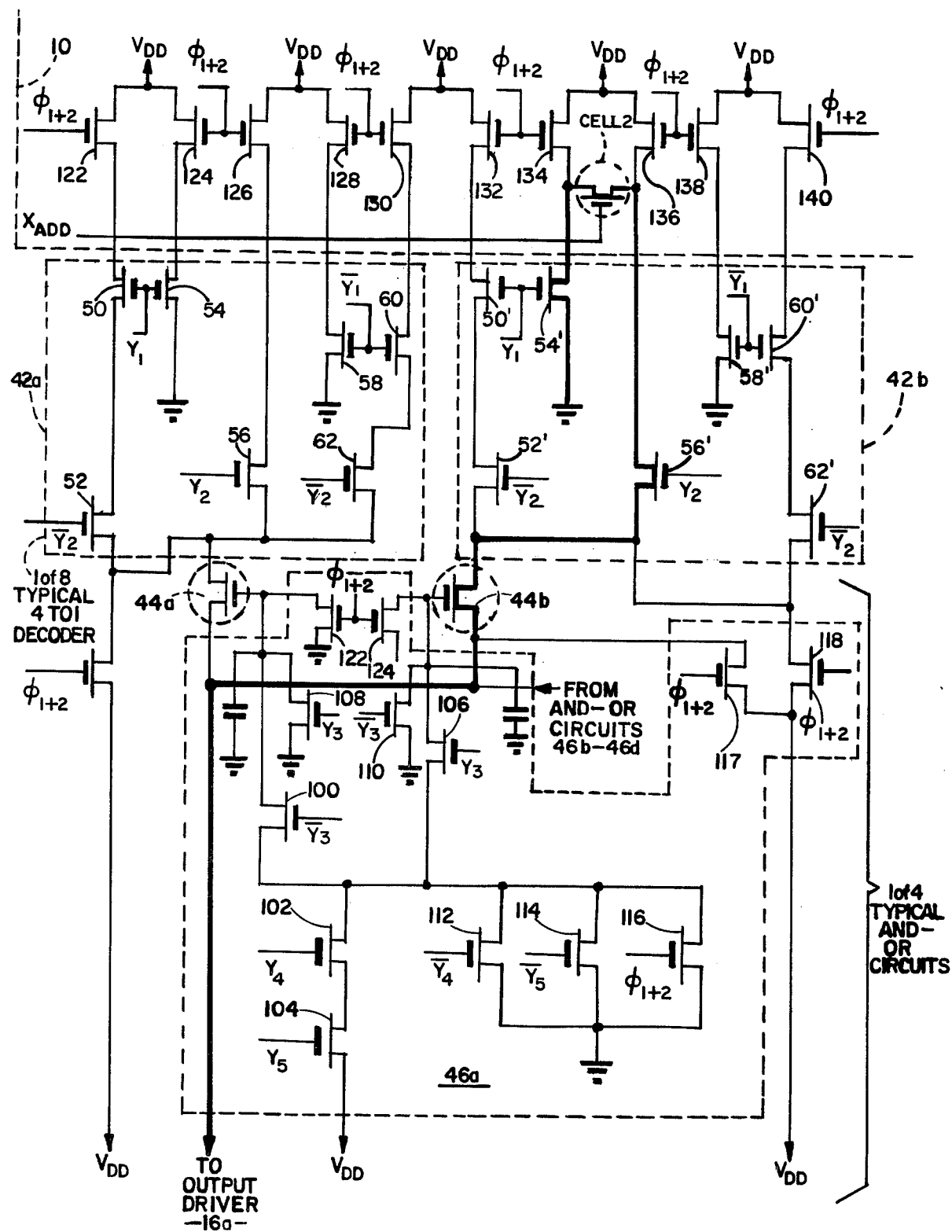
FIG. 6 is a schematic drawing of a portion of the Y decoder of the present invention.

Referring now to FIG. 6, there is shown a schematic representation of a portion of a preferred embodiment of the Y address decoder 40 of FIG. 5. It will be observed that two of the eight 4-to-1 selectors 42a through 42h are included in FIG. 6. It will also be observed that the two selectors 42a and 42b are identical to each other and also identical to the 4-to-1 selectors of the prior art Y address decoder 14a. Accordingly, the reference numbers used to identify the FET stages of 4-to-1 selector 42a in FIG. 6 are the same as those used to identify the corresponding FET stages of 4-to-1 selector 22a of prior art FIG. 3. Similarly, corresponding primed numbers are used to identify corresponding FET stages in 4-to-1 selector 42b of FIG. 6.

As shown in FIG. 6, a gated FET 44a is associated with 4-to-1 selector 42a and a gated FET 44b is associated with 4-to-1 selector 42b. It will be understood that the remaining six 4-to-1 selectors, namely selectors 42c through 42h, have associated therewith, respectively, on a 1-to-1 basis, six gated FETs 44c through 44h (not shown in FIG. 6). The single output line of each 4-to-1 selector is connected to the source electrode of a gated FET. The drain electrodes of all the gated FETs are connected together and are also connected to the output driver 16a. Thus, when a gated FET is rendered conductive, the output signal of the 4-to-1 selector applied to the source electrode of that gated FET is selected for application to the output driver 16a.

In order to avoid an ambiguity and erroneous output, only one gated FET is rendered conductive at any one time in accordance with the operation of AND/OR circuits 46a through 46d. AND/OR circuits 46a through 46d prevent ambiguity by responding to Y address signals Y3 through Y5 to select one, and only one, gated FET to be rendered conductive. Before proceeding with a detailed description of AND/OR circuits 46a through 46d associated with the present invention, it is suitable at this point to mention the principal advantage provided by the present invention over the prior art decoders represented by FIGS. 2, 3 and 4.

It will be observed, upon examination of FIG. 6, that irrespective of the location of the cell in memory array 10, being evaluated, the number of FET stages through which charge must flow to be applied to the output driver 16a, will always be less than the corresponding number of stages in the prior art decoder to evaluate the same cell location. By way of illustration, it will be recalled that in the discussion of FIG. 3, it was noted that the number of FET stages through which charge flows to evaluate any cell location within memory array 10 by means of the prior art decoder 14a, is either six or seven depending upon the cell location. On the other hand, in the Y decoder 40 of the present invention, the corresponding number of stages through which charge flows to evaluate any cell position within memory array 10 is either three or four depending upon cell location. The reduction of the number of series FET stages in the path of the signal used to evaluate the truth state of the selected cell location of the read only memory unit, produces a commensurate reduction in the time needed for an assessment of the memory cell location. Consequently, the access time to data stored in the read-only memory unit is substantially reduced over prior art devices that employ direct decode logic schemes. A significant reduction in access time results from utilizing a substantial portion of Y address decoder logic to control the conductive state of gated FETs. Since the gated FETs are immediately below the first tier of 4-to-1 selectors within decoder 40, the prior art requirement that the evaluation signal pass through all the tiers of the decoder before reaching the output driver 16a, is obviated in the present invention.

AND/OR circuit 46a will now be described in sufficient detail to enable one of ordinary skill in the art to which the present invention pertains, to fully understand the gate control operation of gated FETs 44a through 44h.

It will be observed in FIG. 6 that the AND/OR circuit 46a receives Y address signals Y3, $\overline{Y3}$, Y4, $\overline{Y4}$, Y5 and $\overline{Y5}$. It will be evident to one of ordinary skill in the computer art that three binary signals are adequate to control the selection of one of eight gated FETs.

P-channel FET transistor stage is rendered conductive when voltage, applied to the gate electrode, exceeds in a negative direction, the voltage applied to the source or drain electrodes by an amount equal to the threshold voltage of the transistor. Accordingly, applying the negative voltage $V_{DD}$ to the gates of gated FETs 44a through 44h renders them conductive. In the case of gated FET 44a, it will be seen from FIG. 6 that voltage $V_{DD}$ is applied to the gate of that stage only when Y address signals Y4 and Y5 are TRUE and Y address signal Y3 is FALSE. On the other hand, gated FET 44b is rendered conductive only when Y address signals Y3, Y4 and Y5 are all TRUE. Furthermore, in order to insure that a gated FET is not inadvertently rendered conductive by a stored charge that has failed to be fully dissipated prior to the current address interval, the gate electrode of each gated FET is connected to ground potential via FET stages having gate electrodes which receive the signals corresponding to the inverse of Y address signals which would otherwise render the gated FET conductive.

Accordingly, it may be seen that the gate terminal of gated FET 44a may be connected to ground potential by any one of the following signals in the following truth states: A TRUE address signal Y3, a FALSE address signal Y4 or a FALSE address signal Y5. Similarly, the gate terminal of gated FET 44b may be connected to ground potential by any one of the following signals in the following states: A FALSE address signal Y3, a FALSE address signal Y4 or a FALSE address signal Y5. In effect, FET stages 100, 102 and 104 comprise an AND circuit for gated FET 44a and FET stages 108, 112 and 114 comprise an OR circuit for gated FET 44a. Similarly, FET stages 106, 102 and 104 comprise an AND circuit for gated FET 44b while FET stages 110, 112 and 114 comprise an OR circuit for gated FET 44b. Thus, a major portion of each such AND/OR circuit is shared by two gated FETs. An additional FET stage 116 is connected in parallel across that portion of the OR circuit comprising FET stages 112 and 114, to provide assurance that terminal A of the AND/OR circuit of FIG. 6 is connected to ground potential during the precharge interval. In this way, all nodes in the AND/OR circuit are initialized to ground potential. This procedure is common in ratioless circuits such as that of FIGS. 3 and 6.

Thus, for an evaluation of CELL 2, the Y address signals would have to be in the following truth states: Y1 — TRUE, Y2 — TRUE, Y3 — TRUE, Y4 — TRUE, and Y5 — TRUE. This is the only combination of Y address signal truth states that will enable gated FET 44b and thereby select the appropriate bit line by means of 4-to-1 decoder 42b. The particular path that is utilized to evaluate the truth state of CELL 2 of FIG. 6 is illustrated in heavier lines.

Figure 8:
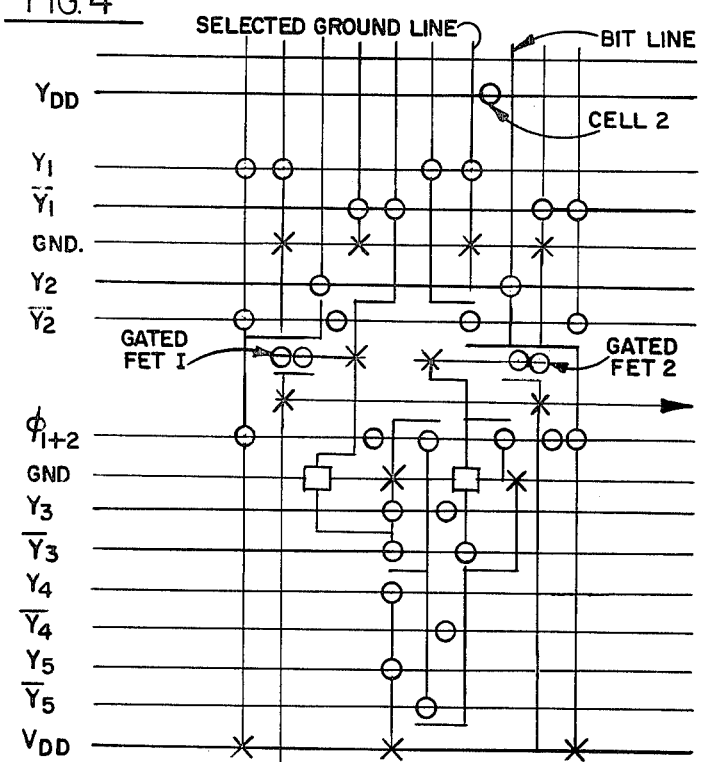
FIG. 8 is a layout drawing of a portion of the Y decoder that employs the present invention.

FIG. 8 is a layout drawing of the same portion of Y decoder 40 as that represented schematically in FIG. 6 with the symbology employed therein being illustrated by FIG. 9.

It should now be understood that the invention described herein is a Y decoder comprising a unique combination of direct decode logic and gating logic which enables bit line and ground line selection of a high density ROM but without the time delay and/or hardware penalties associated with prior art Y decoders. It should now be also understood that although the invention has been described in conjunction with P-channel MOS/LSI, that the invention may also employ other forms of semiconductor devices including N-channel MOS/LSI.

Many details of a type which would be obvious to one skilled in the art have been omitted. For example, means for generating the appropriate clock signals and address signals have not been described. The concept of precharging the inherent capacitance associated with MOS/FET transistor switches has also not been elaborated upon because such concepts are well known in the art. See for example U.S. Pat. No. 3,526,783 issued Sept. 1, 1970, for a description of precharging.

The invention described herein may be employed in many ways different from that specifically set forth, and many variations may be made therein within the scope of the sppended claims.

Having thus described a preferred embodiment of the invention, what is claimed is:

1. In a system having a memory array that is arranged as an X-Y matrix of memory cells, and comprising:
   means providing coded address signals for selecting memory cells for evaluation of the logic state of the signals stored therein,
   an X decoder for decoding the coded address signals corresponding to the X coordinate of the selected memory cell and for applying an X coordinate signal to the memory array to enable evaluation of the memory cells located along the corresponding X coordinate, and
   a Y decoder for decoding the coded address signals corresponding to the Y coordinates of the selected memory cell and for enabling the read-out between the memory cells located along the corresponding Y coordinate and an output terminal of the Y decoder, to enable evaluation of the selected memory cell;
   an improved Y decoder comprising:
   a plurality of signal selectors, each of said selectors signal having a plurality of input lines with at least two of said input lines corresponding respectively to different ones of said Y coordinates, each of said signal selectors having an output terminal to which one of said input lines is connected in response to at least one of said decoder address signals,
   a plurality of gate-controlled switches, each of said switches having a gate electrode, a source electrode and a drain electrode, the source electrodes of said switches connected respectively to the output terminals of said signal selectors, the drain electrodes of said switches connected to each other and to said Y decoder output terminal; and
   at least one AND/OR circuit for generating a gate signal in response to a particular set of coded address signals and for applying said gate signal to a gate electrode of a gate controlled switch whereby said read-out path includes only one of said signal selectors and only one of said gate controlled switches.

2. A circuit responsive to an address code represented by a plurality of address signals applied thereto for selecting an input line from a plurality of signal lines and for applying the signal on a selected bit line to an output line, the circuit comprising:
   a plurality of selectors, each of said selectors having an output terminal to which one of said input lines is connected in response to at least one of said address signals,
   a plurality of gate-signal controlled switches, each of said switches having a gate electrode, a source electrode, and a drain electrode, said source electrodes of said switches connected respectively to the output terminals of said selectors, the drain electrodes of said switches connected to each other and to said output line, and
   at least one AND/OR circuit for generating a gate signal in response to a particular address code and for applying said gate signal to a gate terminal of a gate-signal controlled switch.

3. The circuit recited in claim 2 wherein each of said selectors comprises:
  a plurality of FET switches, the gate electrodes of which are connected to respective address lines providing n address signals for selecting one of N cell locations by means of N-1 bit lines and N-2 ground lines.

4. In a combination comprising a high density read-only memory unit comprising a plurality of conductive regions in a semiconductor substrate, a plurality of address lines and a plurality of bit lines forming a matrix with said conductive regions, said matrix being associated with bit positions of the memory, alternative ones of said conducting regions being conductive to a reference potential and the remaining conductive regions being connectable to a common output for said bit positions and having a plurality of field effect transistors actuated by signals on said address lines, said field effect transistors being selectively connected between adjacent conducting regions for storing data at associated bit positions of the read-only memory unit; and a Y address decoder for receiving a plurality of input signals corresponding to said bit positions and an address code for selecting one input signal to be applied to an evaluation output terminal and of the type having logic circuits which may be configured as tiers of decreasing numbers of selectors for progressively reducing the number of input signal choices in accordance with a pyramid-like selection tree;
  the improvement wherein a portion of said logic circuits is configured to provide a tier of selectors connected respectively to a tier of corresponding gate-controlled switches, the output terminals of said switches being connected together and to said evaluation output terminal, and wherein the remainder of said logic circuits is configured to render conductive one of said controlled switches selected in accordance with said address code.

5. The improvement recited in claim 4 wherein each of said selectors comprises:
  a plurality of FET switches, the gate electrodes of which are connected to respective address lines providing n address signals for selecting one of N cell locations by means of N-1 bit lines and N-2 ground lines.

6. The improvement recited in claim 5 wherein said remainder of said logic circuitry comprises an AND-OR circuit.

* * * * *